(12) United States Patent
Juang

(10) Patent No.: US 6,278,325 B1
(45) Date of Patent: Aug. 21, 2001

(54) PROGRAMMABLE GAIN AMPLIFIER WITH A LARGE EXTENT FOR THE VARIATION OF GAINS

(75) Inventor: Kai-Cheung Juang, NanTou (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/735,976

(22) Filed: Dec. 13, 2000

(51) Int. Cl.[7] .................................................. H03G 3/10
(52) U.S. Cl. ........................ 330/285; 330/278; 330/254
(58) Field of Search .................................. 330/254, 278, 330/285, 279

(56) References Cited

U.S. PATENT DOCUMENTS

| | | | |
|---|---|---|---|
| 5,999,052 | * | 1/2001 | Tang ...................................... 330/254 |
| 6,049,252 | * | 4/2000 | Iwata ..................................... 330/254 |
| 6,157,259 | * | 12/2000 | Dasgupta ............................. 330/296 |
| 6,175,278 | * | 1/2001 | Hasegawa ............................ 330/278 |

* cited by examiner

Primary Examiner—Robert Pascal
Assistant Examiner—Henry Choe

(57) ABSTRACT

A programmable gain amplifier with a large extent for the variation of gains made by a manufacturing process of compensated metal oxide semiconductor or a bipolar junction transistor is disclosed. The structure of the programmable gain amplifier is divided into two stages, a first stage and a second stage. The first stage is formed by connecting a plurality of transistors in parallel, and the second stage is formed by a further plurality of transistors connected in parallel. The first stage and the second stage are connected in series. The current output end of transistors in the first stage each are connected to respective switches, respectively. Another, the current input end of transistors in the second stage each are connected to respective switches, respectively. Each of the switches is connected to a decoder. Therefore, through the control of the decoder, the on and off conditions of the switches can be determined so as to derive the required gain current.

6 Claims, 5 Drawing Sheets

PROGRAMMABLE GAIN AMPLIFIER WITH A LARGE EXTENT FOR THE VARIATION OF GAINS

1. FIELD OF THE INVENTION

The present invention relates to a programmable gain amplifier, and especially to a programmable gain amplifier with a large extent for the variation of gains, which is made by a manufacturing process of complementary metal oxide semiconductor (CMOS) or a bipolar junction transistor (BJT).

2. BACKGROUND OF THE INVENTION

Programmable gain amplifiers are very important in wireless communication system (such as GSM) requiring highly dynamic range. Therefore, a programmable gain amplifier with a larger gain controllable range and highly controllable linearity is beneficial to the whole effect of the system and complexity of the system. The gain control of a programmable gain amplifier can be achieved by changing the direct bias current (change gm of a transistor) and load resistance of an amplifier, wherein the maximum gain change is to control the bias current.

FIG. 1 shows a programmable gain amplifier with a varied gain range in the prior art design (U.S. Pat. No. 4,394,777), wherein the programmable gain amplifier includes a reference current generating circuit, a plurality of resistor elements, an auxiliary reference voltage generator, a plurality of switches which are connected to the resistor elements and a voltage to current converter. In the current gain control method, OP feedback circuit serves to control the depth of a MOS switch for adjusting the direct bias current of an amplifier or using fixed voltage to switch load resistor for change the value of current. While the abovesaid method has the following disadvantages: 1. The OP feedback circuit has a problem of stability. 2. It is difficult to control the depth of MOS switch. 3. The fixing voltage is used in the MOS manufacturing process, the variation of $V_T$ causes that the performance of the circuit can not be controlled. 3. The layout of the resistors occupys a large area and the error in manufacturing process is large. 4. The structure of the circuit is complex. 5. Extra power consumption is required.

SUMMARY OF THE INVENTION

In order to increase the varied range of a gain and the precision of each gain level, and to be suitable for a low cost CMOS manufacturing process, the present invention discloses a new circuit structure for the current technology defect, and meanwhile, the difficult in design is reduced.

To achieve the aforesaid object, the present invention provides a programmable gain amplifier with a large extent for the variation of gains made by a manufacturing process of compensated metal oxide semiconductor or a bipolar junction transistor is disclosed. The structure is divided into two stages, a first stage and a second stage. The first stage is formed by connecting a plurality of transistors in parallel, and the second stage is formed by a further plurality of transistors in parallel. The first stage and the second stage are connected in series. The current output end of transistors in the first stage each are connected to respective switches, respectively. Another, the current input end of transistors in the second stage each are connected to respective switches, respectively. Each of the switches is connected to a decoder. Therefore, through the control of the decoder, the on and off conditions of the switches can be determined so as to derive the required bias current.

One of the programmable gain amplifier with a large extent for the variation of gains is made by a manufacturing process of compensated metal oxide semiconductor. The amount of current is determined wholly from the ratio of the transistor, therefore, the effect of error to the manufacturing process and the shift of temperature is very small. In a compensated metal oxide semiconductor, the gain in a amplifying stage is positively proportional to the transconduce (gm), while the value of gm is positively proportional to the square root value of the bias current (in bipolar, the gm is positively proportional to the bias current). Therefore, in the CMOS circuit, as the varied range of a programmable gain amplifier is enlarged, the varied range of the bias current in the gain stage is also very large, while the circuit structure of the present invention is suitable for this operation, otherwise, the advantages of this design core as following. The gates of CMOSs are not biased directly, therefore, the voltage change in the gate of the CMOS from errors will not effect the work of the circuit. The extra current consumed in the bias current can be avoided so as to achieve the object of power-saving. No resistance is used in the biasing and current control. Comparing with the way of controlling current by serially connecting resistors, the present invention uses smaller layout space and the effect of the error in the manufacturing process is reduced greatly. The required bias current is independently controlled by switches. For an amplifier necessary to precisely controlling the variation of gain, the difficult in design can be reduced.

DESCRIPTION OF THE PREFERRED EMBODIMENT

The present invention will be described in the following with the appended figures. Those skilled in the art should be understand that the following description is just as an example for causing those skilled in the art to full understand the present invention but not to used to confine the present invention.

Figure 1:
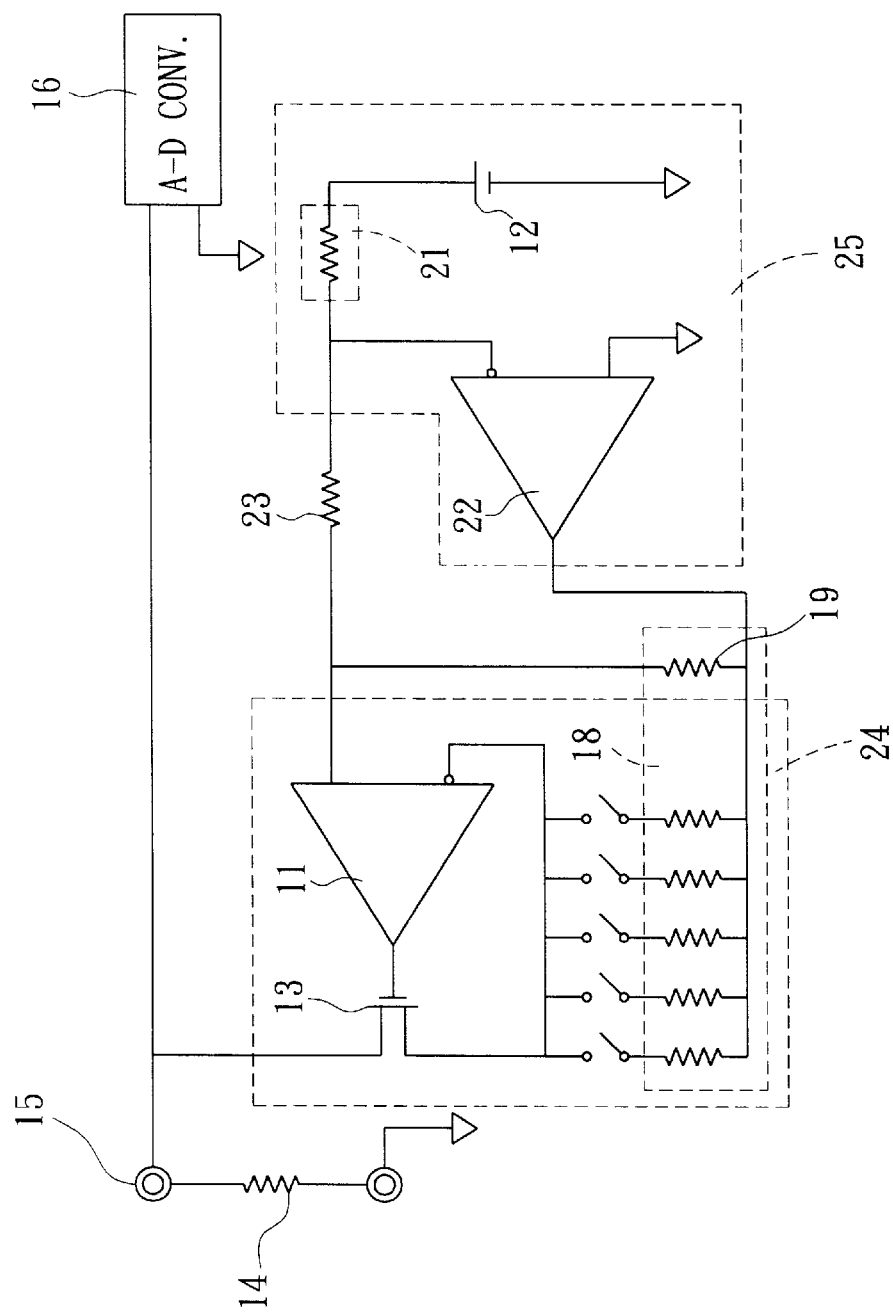
FIG. 1 shows a programmable gain amplifier with a varied gain range in the prior art.
Figure 2:
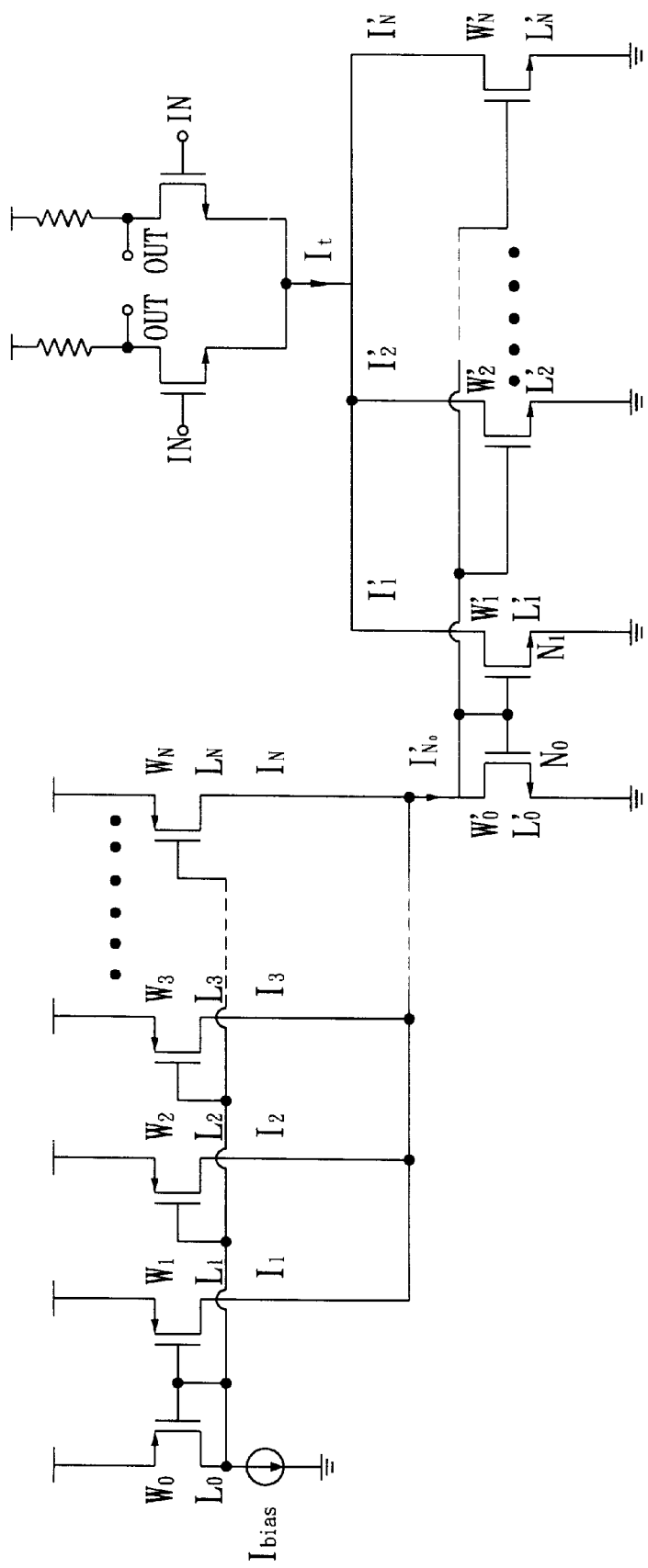
FIG. 2 is a circuit structure diagram of the a programmable gain amplifier with a large extent for the variation of gains made by a manufacturing process of complementary metal oxide semiconductor according to the present invention, wherein the circuit does not contain switches and decoder.
Figure 3:
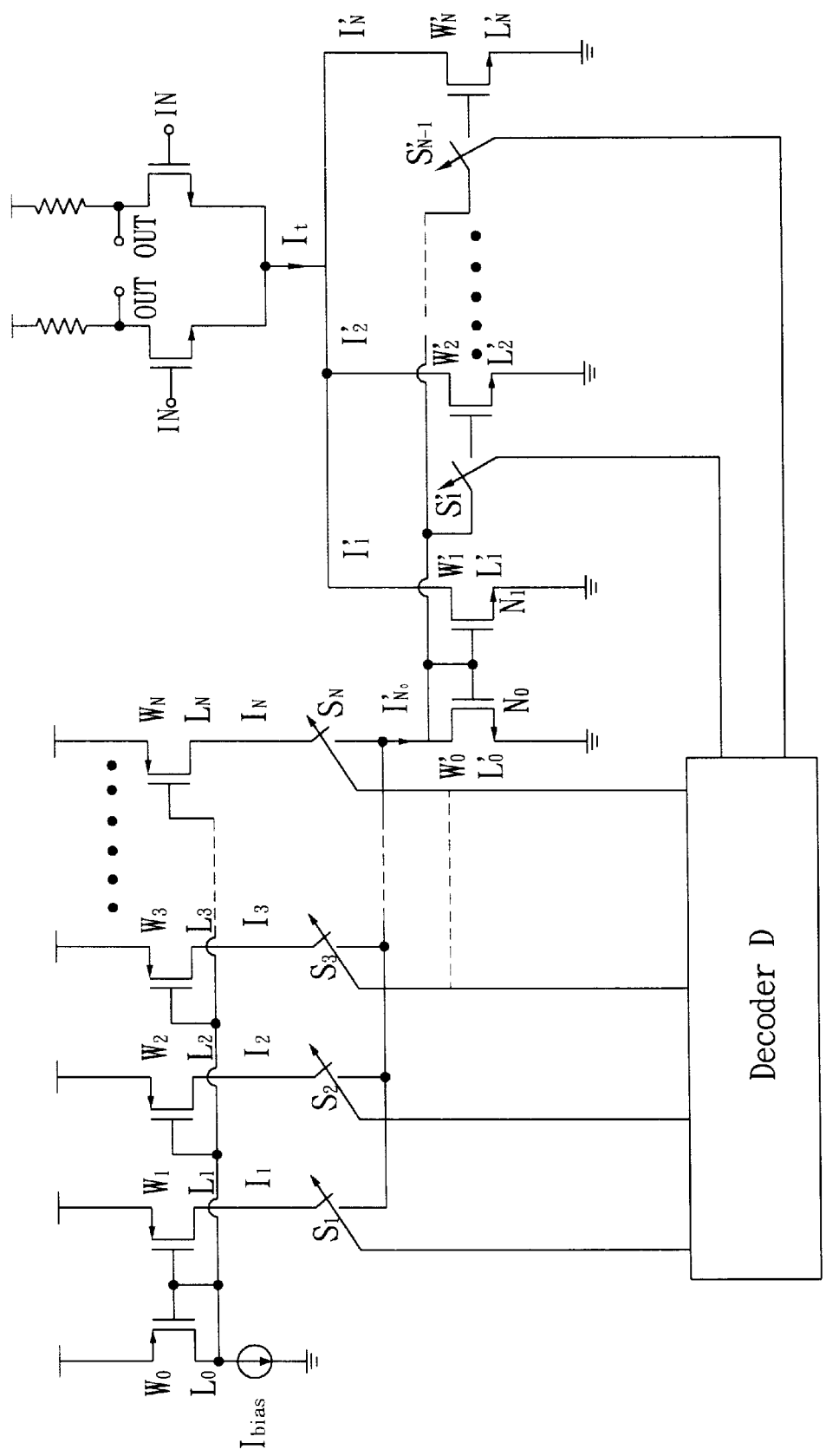
FIG. 3 is a circuit structure diagram of the a programmable gain amplifier with a large extent for the variation of gains made by a manufacturing process of complementary metal oxide semiconductor according to the present invention, wherein the circuit contains switches and decoder.

In order to resolve the abovesaid prior art problem, the present invention discloses a novel design. FIGS. 2 and 3 show the first embodiment in the present invention, wherein a programmable gain amplifier with a large extent for the variation of gains made by a manufacturing process of compensated metal oxide semiconductor is illustrated. The structure is divided into two stages, a first stage and a second stage. The first stage is made by connecting PMOSs group, $P_0$ and $P_1$ to $P_N$ in parallel, wherein $P_1$ to $P_N$ are PMOS of different sizes. The second stage is installed by connecting NMOS $N_0$ and $N_1$ to $N_M$ in parallel, wherein $N_1$ to $N_N$ are NMOSs of different sizes. The width of CMOSs are $W_i$ to W'i, respectively and the lengths are Li and L', respectively, wherein i is equal to 0 to N. In the first stage, each transistor is biased by a bias current $I_{bias}$ The $I_{bais}$ is a stable current source. The mirror current $I_1$ to $I_N$ is from the $P_0$ and $P_1$ to $P_N$ for controlling the size. All these current flow to $N_0$, then by $N_1 \ldots N_M$, mirror current $I_1' I_M'$ are generated. The sum of $I_1' \sim I_M'$ is $I_t$, $I_t$ is the bias current flowing through amplifier stage of the programmable gain amplifier, wherein $I_t$ can be represented as:

$$It = Ibias \times \left[\frac{L_0}{W_0}\left(\frac{W_1}{L_1} + \frac{W_2}{L_2} + \ldots + \frac{W_N}{L_N}\right)\right] \times$$
$$\left[\frac{L_0'}{W_0'}\left(\frac{W_1'}{L_1'} + \frac{W_2'}{L_2'} + \ldots + \frac{W_M'}{L_M'}\right)\right]$$

where $W_i$ and W'i are the width of CMOS, while Li and L'i are the length of the CMOS; and $I_{bais}$ is the bias current source for voltage stability.

Referring to FIG. 3, in this embodiment, the drains of the transistor in the first stage is serially connected with switches, $S_1 \sim SN_N$, and the source of the transistor in the second stage is serially connected to switches, $S'_1 \sim S'_M$. The actions of $P_1 \sim P_N$ is determined from the on-off conditions of the switches $S_1 \sim S_N$. The action of $N_1' \sim N_M'$ is controlled by the switches $S_1' S_M'$. These switches all are connected to a decoder. Therefore, the above equation can be represented as:

$$It = Ibias \times \left[A_0 \frac{L_0}{W_0}\left(A_1 \frac{W_1}{L_1} + A_2 \frac{W_2}{L_2} + \ldots + A_N \frac{W_N}{L_N}\right)\right] \times$$
$$\left[A_0' \frac{L_0'}{W_0'}\left(A_1' \frac{W_1'}{L_1'} + A_2' \frac{W_2'}{L_2'} + \ldots + A_N' \frac{W_N'}{L_N'}\right)\right]$$

wherein the as the switch Si is conductive, Ai is 1, while as switch Si is not conductive, then Ai is 0. When the switch S'i is conductive, then A'i is 1, while as switch S'i is not conductive, then A'i is 0.

Therefore, through the control of the decoder D to determine which ones of the current $I_1-I_N$ and $I'_1-I'_N$ should be operated, the required gain current can be obtained. That is, as a required gain is obtained, the decoder will determine the conditions of all the switches according to above equation (i.e., to determine the required ratios of the (W/L)s).

Figure 4:
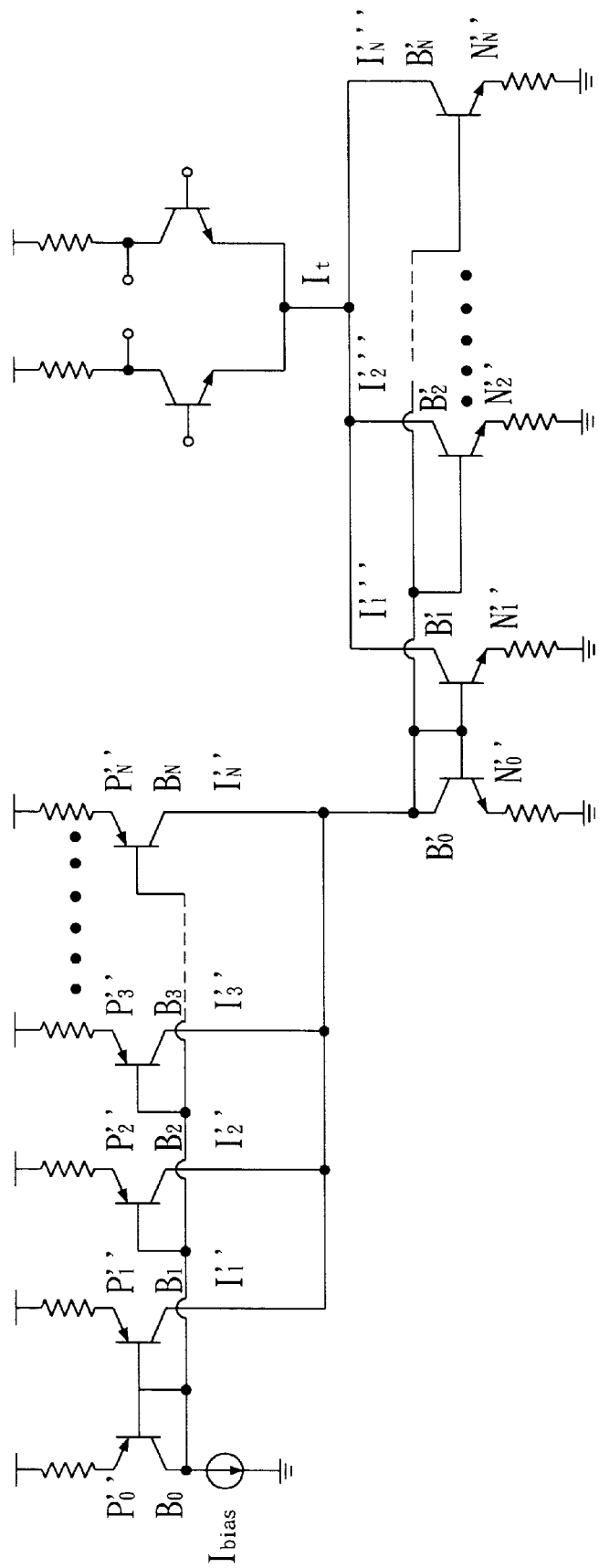
FIG. 4 is a circuit structure diagram of the a programmable gain amplifier with a large extent for the variation of gains made by a manufacturing process of bipolar junction transistor according to the present invention, wherein the circuit does not contain switches and decoder.
Figure 5:
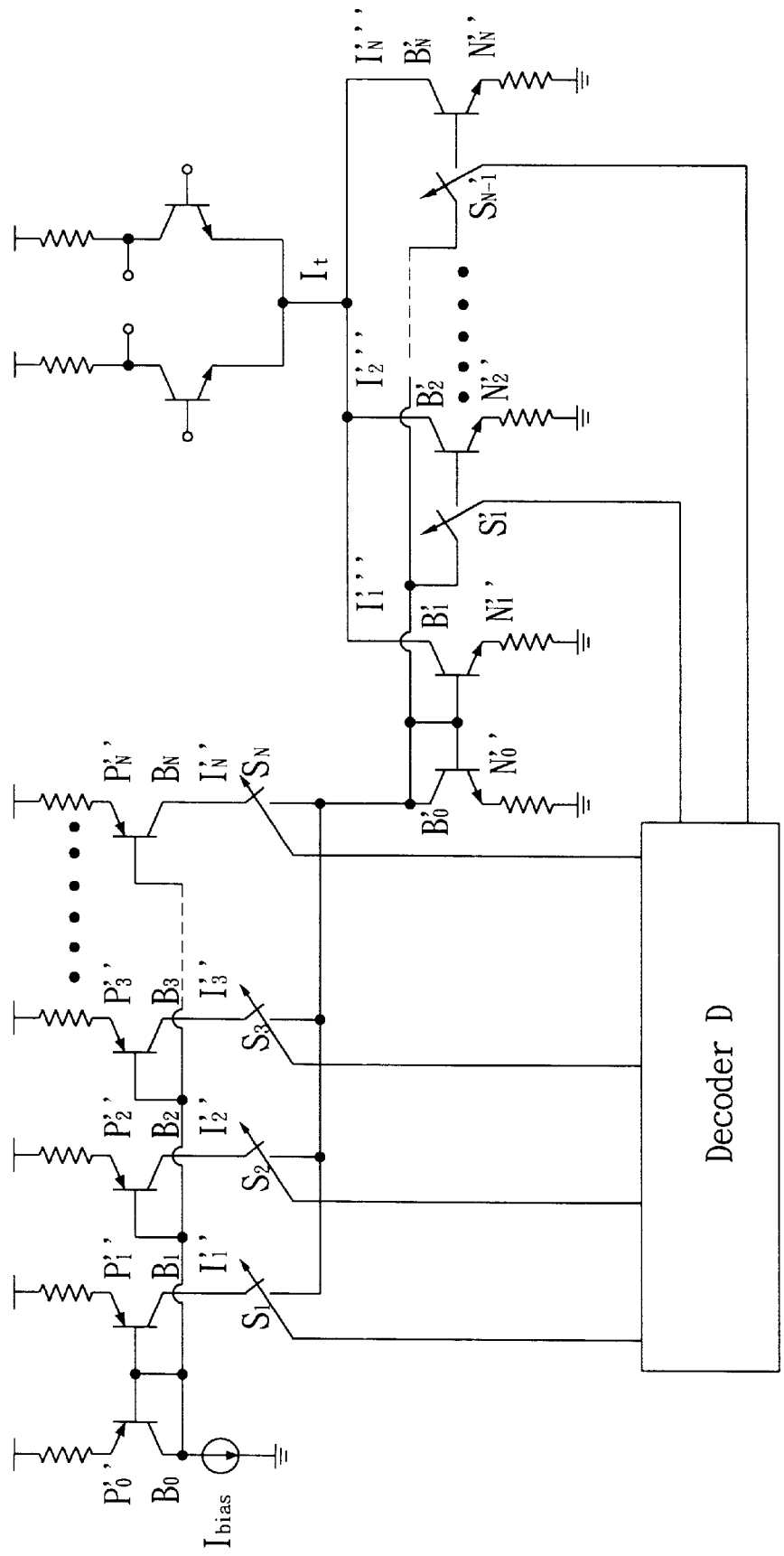
FIG. 5 is a circuit structure diagram of the a programmable gain amplifier with a large extent for the variation of gains made by a manufacturing process of bipolar junction transistor according to the present invention, wherein the circuit contains switches and decoder.

FIGS. 4 and 5 show the first embodiment in the present invention, wherein a programmable gain amplifier with a large extent for the variation of gains made by a manufacturing process of bipolar junction transistor is illustrated. The structure is divided into two stages, a first stage and a second stage. The first stage is made by connecting bipolar junction transistor group, $P''_0$ and $P''_1$ to $P''_N$ in parallel, wherein $P''_1$ to $P∴_N$ are PNP bipolar junction transistor of different sizes. The second stage is installed by connecting bipolar junction transistor $N''_0$ and $N''_1$ to $N''_M$ in parallel, wherein $N''_1$ to $N''_N$ are NPN bipolar junction transistor of different sizes. The sizes of bipolar junction transistors are Bi to B'i, respectively, wherein i is equal to 0 to the larger one of N and M. In the first stage, the current in the gate of each transistor is provided by a bias current $I_{bais}$. The $I_{bias}$ is a stable current source. The mirror current $I''_1$ to $I''_N$ is from the $P''_0$ and $P''_1$ to $P''_N$ for controlling the size. All these current are flow to $N''_0$, then by $N''_1 N''_M$, mirror current $I'''_1$ $I'''_M$ are generated. The sum of $I'''_1 \sim I'''_M$ is $I'_t$, $I'_t$ is the bias current flowing through the amplifier stage of the programmable gain amplifier, wherein $I_t$ can be represented as:

$$I't = Ibias \times \left[\frac{1}{B_0}(B_1 + B_2 + \ldots + B_N)\right] \times \left[\frac{1}{B_0'}(B_1 + B_2 + \ldots + B_M)\right]$$

where Bi and B'i are sizes of bipolar junction transistor.

Referring to FIG. 5, in this embodiment, each the collector of the transistor in the first stage is serially connected with a switch, $S_1 \sim S_N$, and the collector of the transistor in the second stage is serially connected to a switch, $S'_1 \sim S'_M$. The actions of $P_1 \sim P_N$ is determined from the on-off conditions of the switches $S_1 \sim S_N$. The action of $N_1' \sim N_M'$ is controlled by the switch $S_1' \sim S_M'$. These switches all are connected to a decoder. Therefore, the above equation can be represented as:

$$I't = Ibias \times \left[A_0 \frac{1}{B_0}(A_1 B_1 + A_2 B_2 + \ldots + A_N B_N)\right] \times$$
$$\left[A_0' \frac{1}{B_0'}(A_1' B_1 + A_2' B_2 + \ldots + A_M' B_M)\right]$$

wherein the as the switch Si is conductive, Ai is 1, while as switch Si is not conductive, then Ai is 0. When the switch S'i is conductive, then A'i is 1, while as switch S'i is not conductive, then A'i is 0.

Therefore, through the control of the decoder D to determine which ones of the current $I_1-I_N$ and $I'_1-I'_N$ should be operated, the required gain current can be obtained. That is, as a required gain is obtained, the decoder will determine the conditions of all the switches according to above equation (i.e., to determine the required sizes of the bipolar junction transistor). By this way, the It can be controller in a range of 20 $\mu$A to several mA and required current can be calculated precisely.

The advantages of this circuit structure are:
1. The amount of current is determined wholly from the ratio of the transistor, therefore, the effect of error to the manufacturing process and the shift of temperature is very small.
2. In a complementary metal oxide semiconductor, the gain in a amplifying stage is positively proportional to the transconduce (gm), while the size of gm is positively proportional to the square root value of the bias current (in bipolar, the gin is positively proportional to the bias current), therefore, in the CMOS circuit, as the varied range of a programmable gain amplifier is enlarged, the varied range of the bias current in the gain stage is also very large, while the circuit structure of the present invention is suitable for this operation.
3. The gates of CMOSs are not biased directly, therefore, the $V_T$ change in the process of the CMOS from errors will not effect the work of the circuit.
4. The last bias current $I_t$ is from the multiples of $I_{bias}$, thus in a large current operation, the extra current consumed in the bias current can be avoided so as to achieve the object of power-saving.
5. No resistance is used in the biasing and current control. Comparing with the way of controlling current by serially connecting resistors, the present invention uses smaller layout space and the effect of the error in the manufacturing process is reduced greatly.

6. The required bias current is independently controlled by switch $S_1$~$S_N$ and $S_1'$~$S_N'$. For an amplifier necessary to precisely controlling the variation of gain, the difficult in design can be reduced.

The present invention are thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A programmable gain amplifier with a large extent for the variation of gains made by a manufacturing process of complementary metal oxide semiconductor (CMOS); wherein the structure is divided into two stages, a first stage and a second stage; the first stage is made by connecting PMOSs group, $P_0$ and $P_1$ to $P_N$ in parallel, wherein $P_1$ to $P_N$ are PMOS of different sizes; the second stage is installed by connecting NMOS $N_0$ and $N_1$ to $N_M$ in parallel, wherein $N_1$ to $N_N$ are NMOSs of different sizes; widths of CMOSs are Wi to W'i, respectively and the lengths are Li and L', respectively, wherein i is equal to 0 to N, in the first stage, each transistor is biased by a bias current $I_{bais}$; then bias current $I_t$ flowing through amplifier stage of the programmable gain amplifier is:

$$It = Ibias \times \left[\frac{L_0}{W_0}\left(\frac{W_1}{L_1} + \frac{W_2}{L_2} + \ldots + \frac{W_N}{L_N}\right)\right] \times$$
$$\left[\frac{L_0'}{W_0'}\left(\frac{W_1'}{L_1'} + \frac{W_2'}{L_2'} + \ldots + \frac{W_M'}{L_M'}\right)\right]$$

where Wi and W'i are the width of CMOS, while Li and L'i are the length of the CMOS; and $I_{bias}$ is the bias current source for voltage stability.

2. The programmable gain amplifier with a large extent for the variation of gains made by a manufacturing process of compensated metal oxide semiconductor as claimed in claim 1, wherein drains of transistors in the first stage are serially connected with switches, $S_1$~$S_N$, respectively, and sources of transistors in the second stage are serially connected to switches, $S_1'$~$S_M'$; actions of $P_1$~$P_N$ are determined from the on-off conditions of the switches $S_1$~$S_N$. and actions of $N_1'$~$N_M'$ are controlled by the switch $S_1'$~$S_M'$; therefore, the above equation is represented as:

$$It = Ibias \times \left[A_0 \frac{L_0}{W_0}\left(A_1 \frac{W_1}{L_1} + A_2 \frac{W_2}{L_2} + \ldots + A_N \frac{W_N}{L_N}\right)\right] \times$$
$$\left[A_0' \frac{L_0'}{W_0'}\left(A_1' \frac{W_1'}{L_1'} + A_2' \frac{W_2'}{L_2'} + \ldots + A_N' \frac{W_N'}{L_N'}\right)\right]$$

where as the switch Si is conductive, Ai is 1, while as switch Si is not conductive, then Ai is 0; when the switch S'i is conductive, then A'i is 1, while as switch S'i is not conductive, then A'i is 0.

3. The programmable gain amplifier with a large extent for the variation of gains made by a manufacturing process of complementary metal oxide semiconductor as claimed in claim 1, wherein all switches are connected to a decoder in parallel; through the control of the decoder D to determine which ones of the current $I_1$–$I_N$ and $I_1'$–$I_N'$ should be operated, a required gain current can be obtained; that is, as it wants to obtain a required gain, the decoder will determine the on and off conditions of all the switches according to above equation (i.e., to determine the required ratios of the (W/L)s).

4. A programmable gain amplifier with a large extent for the variation of gains made by a manufacturing process of bipolar junction transistor, wherein the structure is divided into two stages, a first stage and a second stage, the first stage is made by a connecting bipolar junction transistor group, $P''_0$ and $P''_1$ to $P''_N$ in parallel, wherein $P''_1$ to $P''_N$ are PNP bipolar junction transistor of different sizes; the second stage is installed by connecting bipolar junction transistor $N''_0$ and $N''_1$ to $N''_M$ in parallel, wherein $N''_1$ to $N''_N$ are NPN bipolar junction transistor of different sizes; the sizes of bipolar junction transistors are Bi to B'i, respectively, wherein i is equal to 0 to the larger one of N and M; in the first stage, each transistor is biased by a bias current $I_{bias}$; where $I_{bias}$ is a stable bias current source for voltage stability; $I'_t$ is the bias current flowing through the amplifier stage of the programmable gain amplifier, thus, $I_t$ can be represented as:

$$I't = Ibias \times \left[\frac{1}{B_0}(B_1 + B_2 + \ldots + B_N)\right] \times \left[\frac{1}{B_0}(B_1 + B_2 + \ldots + B_M)\right]$$

where Bi and B'i are sizes of bipolar junction transistor.

5. The programmable gain amplifier with a large extent for the variation of gains made by a manufacturing process of bipolar junction transistor as claimed in claim 4, wherein each the collector of the transistor in the first stage is serially connected with switches, $S_1$~$S_N$, and the collectors of the transistors in the second stage are serially connected to switches, $S_1'$~$S_M'$, actions of $P_1$~$P_N$ are determined from the on-off conditions of the switches $S_1$~$S_N$, actions of $N_1'$~$N_M'$ are controlled by the switches $S_1'$~$S_M'$; therefore, the above equation can be represented as:

$$I't = Ibias \times \left[A_0 \frac{1}{B_0}(A_1 B_1 + A_2 B_2 + \ldots + A_N B_N)\right] \times$$
$$\left[A_0' \frac{1}{B_0}(A_1' B_1 + A_2' B_2 + \ldots + A_M' B_M)\right]$$

wherein as the switch Si is conductive, Ai is 1, while as switch Si is not conductive, then Ai is 0. When the switch S'i is conductive, then A'i is 1, while as switch S'i is not conductive, then A'i is 0.

6. The programmable gain amplifier with a large extent for the variation of gains made by a manufacturing process of bipolar junction transistor as claimed in claim 4, wherein all switches are connected to a decoder in parallel; through the control of the decoder D to determine which ones of the current $I_1$–$I_N$ and $I_1'$–$I_N'$ should be operated, the required gain current can be obtained; that is, as it wants to acquire a required gain, the decoder will determine the conditions of all the switches according to above equation (i.e., to determine the required sizes of the bipolar junction transistor).

* * * * *